(12) United States Patent
Hong et al.

(10) Patent No.: US 7,741,717 B2
(45) Date of Patent: Jun. 22, 2010

(54) METAL LINE OF SEMICONDUCTOR DEVICE AND METHOD OF FABRICATING THE SAME

(75) Inventors: Young Ok Hong, Kyeonggi-do (KR); Dong Hwan Lee, Seoul (KR)

(73) Assignee: Hynix Semiconductor, Inc., Kyoungki-do (KR)

( * ) Notice: Subject to any disclaimer, the term of this patent is extended or adjusted under 35 U.S.C. 154(b) by 581 days.

(21) Appl. No.: 11/771,214

(22) Filed: Jun. 29, 2007

(65) Prior Publication Data

US 2008/0014734 A1 Jan. 17, 2008

(30) Foreign Application Priority Data

Jul. 5, 2006 (KR) ............ 10-2006-0063084
Aug. 7, 2006 (KR) ............ 10-2006-0074131

(51) Int. Cl.
*H01L 23/48* (2006.01)
*H01L 23/52* (2006.01)
*H01L 29/40* (2006.01)

(52) U.S. Cl. .............. 257/758; 257/314; 257/315; 257/316; 257/203; 257/208; 257/211; 257/774; 257/E29.129; 257/E29.3; 257/E21.179; 257/E21.422; 257/E21.68; 438/201; 438/211; 438/257; 438/593; 438/622

(58) Field of Classification Search ......... 257/314–316, 257/203, 208, 211, 758, 774, E29.129, E29.3, 257/E21.179, E21.422, E21.68; 438/201, 438/211, 257, 593, 618, 622, FOR. 203, FOR. 355
See application file for complete search history.

(56) References Cited

U.S. PATENT DOCUMENTS

| 2003/0064578 | A1* | 4/2003 | Nakamura et al. ......... 438/627 |
| 2003/0216001 | A1 | 11/2003 | Lee et al. |
| 2004/0051133 | A1 | 3/2004 | Sugita et al. |
| 2005/0218439 | A1* | 10/2005 | Lee et al. ................... 257/296 |
| 2008/0048340 | A1* | 2/2008 | Lee et al. ................... 257/774 |
| 2008/0122076 | A1* | 5/2008 | Hong et al. ................. 257/734 |

FOREIGN PATENT DOCUMENTS

| CN | 1230027 | 9/1999 |
| JP | 2001-024163 | 1/2001 |
| KR | 1992-18915 | 10/1992 |
| KR | 10-2000-0012875 | 3/2000 |
| KR | 1020030068776 | 8/2003 |
| KR | 10-2004-0084400 | 10/2004 |

* cited by examiner

*Primary Examiner*—Michelle Estrada
(74) *Attorney, Agent, or Firm*—Lowe Hauptman Ham & Berner LLP (57) ABSTRACT

A metal line of a semiconductor device comprising contact plugs, a plurality of first trenches, first metal lines, a plurality of second trenches, and second metal lines. The contact plugs are formed over a semiconductor substrate and are insulated from each other by a first insulating layer. The plurality of first trenches are formed in the first insulating layer and are connected to first contact plugs of the contact plugs. The first metal lines are formed within the first trenches and are connected to the first contact plugs. The plurality of second trenches are formed over the first metal lines and the first insulating layer and comprise a second insulating layer connected to second contact plugs of the contact plugs. The second metal lines are formed within the second trenches and are connected to the second contact plugs.

20 Claims, 7 Drawing Sheets

FIG. 3C $a' = \sqrt{a^2 + h^2} > a$

METAL LINE OF SEMICONDUCTOR DEVICE AND METHOD OF FABRICATING THE SAME

CROSS-REFERENCES TO RELATED APPLICATIONS

The present application claims priority to Korean patent application number 10-2006-063084, filed on Jul. 5, 2006 and Korean patent application number 10-2006-074131, filed on Aug. 7, 2006, which are incorporated by reference in its entirety.

BACKGROUND OF THE INVENTION

The present invention relates, in general, to semiconductor devices and, more particularly, to a metal line of a semiconductor device and a method of fabricating the same, which can be applied to a bit line formation process of flash memory devices.

As the integration of flash memory gradually increases, the dimension of devices also decreases. In recent years, the loading capacitance of flash memory between bit lines is very high since the pitch of the bit line is very small. In particular, in a page buffer having a pitch smaller than that of a cell, loading capacitance between bit lines is very high. Thus, as interference between neighboring bit lines, a reduction in the cell current and the operating speed occur. Further, as the pitch of the bit line decreases, a bit line bridge phenomenon in which neighboring bit lines are adhered together can occur.

SUMMARY OF THE INVENTION

Accordingly, the present invention addresses the above problems, and discloses a metal line of a semiconductor device and a method of fabricating the same, in which even bit lines and odd bit lines are formed over different layers in order to generate steps between the even bit lines and the odd bit lines and increase the distance between the even bit lines and the odd bit lines, thus decreasing loading capacitance between the bit lines and preventing inter-bit line bridge.

In an aspect of the present invention, there is provided a metal line of a semiconductor device, comprising contact plugs formed over a semiconductor substrate and insulated from each other by a first insulating layer, a plurality of first trenches formed in the first insulating layer and connected to first contact plugs of the contact plugs, which belong to one of an odd-numbered group and an even-numbered group, first metal lines formed within the first trenches and connected to the first contact plugs, a plurality of second trenches formed over the first metal lines and the first insulating layer and comprising a second insulating layer connected to second contact plugs of the contact plugs, which belong to the other of the odd-numbered group and the even-numbered group, and second metal lines formed within the second trenches and connected to the second contact plugs.

The contact plugs can include drain contact plugs of a NAND flash memory device and can be arranged in a line.

The first metal lines can include odd bit lines of a NAND flash memory device and the second metal lines can include even bit lines. Alternatively, the first metal lines can include the even bit lines and the second metal lines can include the odd bit lines.

The first metal lines and the second metal lines can be connected to a plurality of page buffers.

The sum of the height of the first contact plug and the height of the first metal line can be identical to that of a height of the second contact plug.

In another aspect of the present invention, there is provided a metal line of a semiconductor device, comprising contact plugs formed over a semiconductor substrate and insulated from each other by a first insulating layer, a plurality of first metal lines formed in the first insulating layer and connected to first contact plugs of the contact plugs, which belong to one of an odd-numbered group and an even-numbered group, a plurality of conductive layers formed over second contact plugs, which belong to the other of the odd-numbered group and the even-numbered group of the contact plugs, forming a second insulating layer over the first insulating layer between the first metal lines and the conductive layers, and a plurality of second metal lines formed over the second insulating layer and electrically connected to the conductive layers.

The conductive layer can extend from on the first contact plugs to on the first insulating layer and have a width wider than the first contact plugs.

In still another embodiment of the present invention, there is provided a method of forming metal lines of a semiconductor device, comprising providing a semiconductor substrate in which contact plugs insulated by a first insulating layer are formed, forming first trenches connected to first contact plugs of the contact plugs, which belong to one of an odd-numbered group and an even-numbered group, in the first insulating layer, forming first metal lines within the first trenches, forming a second insulating layer over the first insulating layer comprising the first metal lines, forming second trenches in the second insulating layer so that second contact plugs of the contact plugs, which belong to the other of the odd-numbered group and the even-numbered group, are exposed, and forming second metal lines in the second trenches.

In further still another embodiment of the present invention, there is provided a method of forming metal lines of a semiconductor device, comprising providing a semiconductor substrate in which contact plugs insulated by a first insulating layer are formed, forming a conductive layer over first contact plugs of the contact plugs, which belong to one of an odd-numbered group and an even-numbered group, and forming first metal lines connected to second contact plugs, which belong to the other of the odd-numbered group and the even-numbered group, over the first insulating layer, forming a second insulating layer over the first insulating layer between the conductive layer and the first metal lines, and forming second metal lines connected to the conductive layer over the second insulating layer.

DETAIL DESCRIPTION OF THE PREFERRED EMBODIMENTS

Now, specific embodiments according to the present patent will be described with reference to the accompanying drawings.

FIGS. 1A to 1F are cross-sectional perspective views illustrating a method of a flash memory device in accordance with an embodiment of the present invention.

Figure 1A:
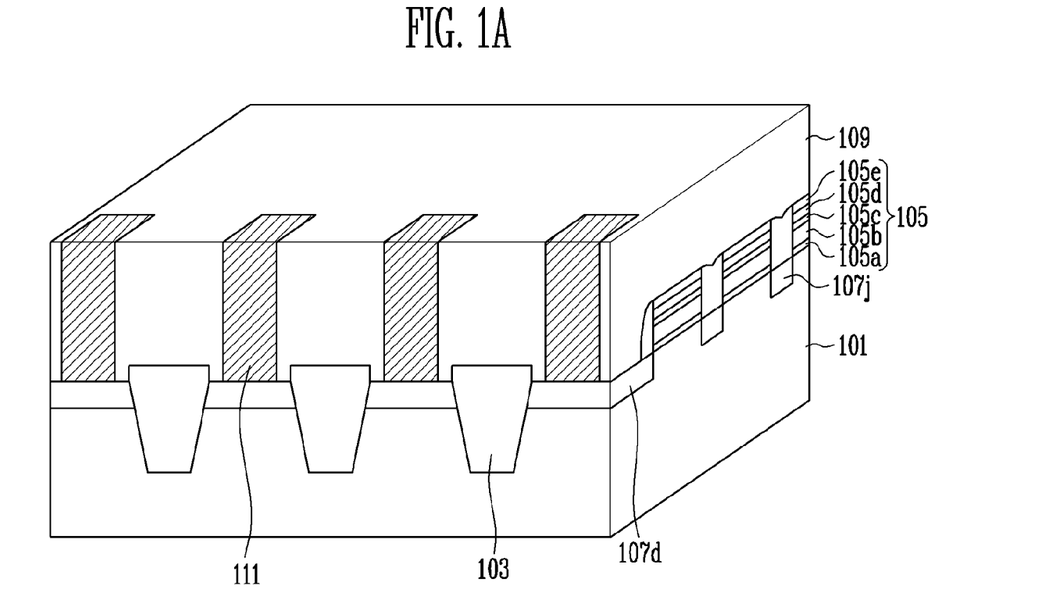
FIGS. 1A to 1F illustrate cross-sectional views illustrating a method of a flash memory device in accordance with an embodiment of the present invention.

Referring to FIG. 1A, semiconductor elements, isolation layers 103 and flash memory cells 105, are formed in a semiconductor substrate 101. Each flash memory cell 105 includes a tunnel insulating layer 105a, a floating gate 105b, a dielectric layer 105c, a control gate 105d, and a hard mask 105e. In a NAND flash memory device, a memory cell array has a string structure in which a drain select transistor, a plurality of the flash memory cells 105, and a source select transistor are sequentially formed. The select transistor can have the same structure as that of the flash memory cell 105, but differs from the flash memory cell in that the floating gate and the control gate are electrically connected. Junction regions 107j are formed in the semiconductor substrate 101 between the flash memory cells 105. A drain 107d and a source (not shown) are formed at both sides of the string structure. The drain 107d becomes the drain of a drain select transistor.

A first insulating layer 109 is formed over the semiconductor substrate 101 in which the above semiconductor elements are formed. The first insulating layer 109 can be formed from an oxide layer, such as a high-density plasma (HDP) oxide layer. Contact holes are formed in specific regions of the first insulating layer 109. A conductive layer is formed over the first insulating layer 109 so that the contact holes are filled. The conductive layer is etched so that it remains within the contact holes, thus forming contact plugs 111. The etch process of the conductive layer can be performed by a chemical mechanical polishing (CMP) process or an etch-back process. The contact plugs 111 can become drain contact plugs in a NAND flash memory device.

In the above, before the drain contact plugs 111 are formed, source contact plugs can be formed in a NAND flash memory device. This technique has already been known in NAND flash memory devices and, therefore, will not be described in detail.

Figure 1B:
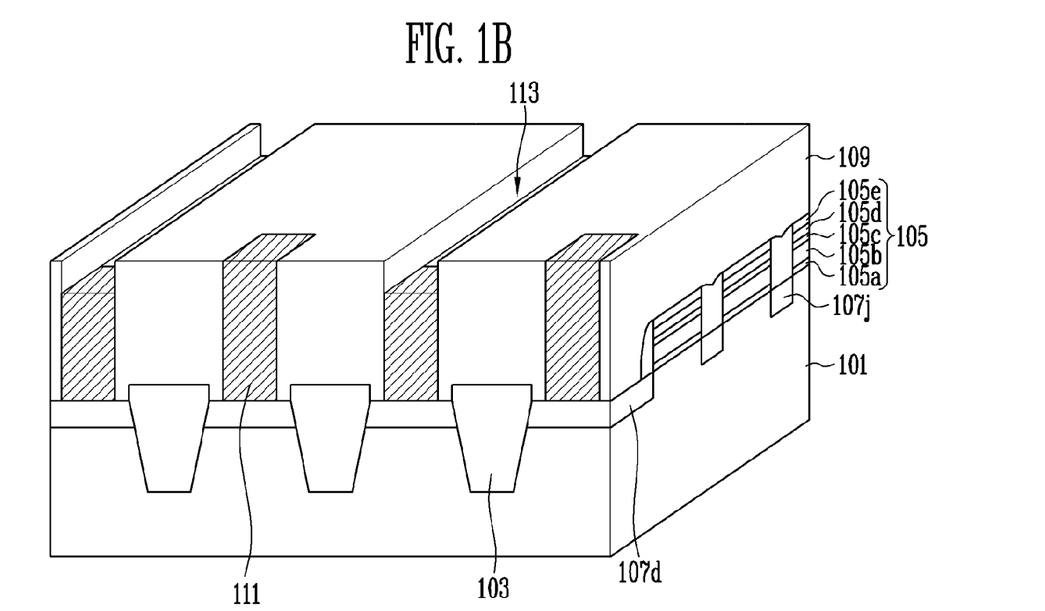

Referring to FIG. 1B, bit lines are formed in a subsequent process. The bit lines can be classified into odd bit lines and even bit lines depending on an arrangement order. The contact plugs 111 and the first insulating layer 109 of regions where the odd bit lines will be formed are etched to form first trenches 113. The depth of each first trench 113 decides the height of the odd bit lines to be formed in a subsequent process. Thus, when the odd bit lines are formed thickly, the first trenches 113 are formed deep, and when the odd bit lines are formed thinly, the first trenches 113 are formed shallowly. In the above process, the contact plugs 111 and the first insulating layer 109 are not etched in the remaining regions other than the region where the even bit lines will be formed.

In the etch process of forming the first trenches 113, a photoresist pattern (not shown) in which the region where the odd bit lines will be formed is defined can be used as an etch mask. Meanwhile, in order to form the first trenches 113, both the contact plugs 111 and the first insulating layer 109 must be etched. Thus, the first trenches 113 are formed by performing an etch process under an etch condition where the contact plugs 111 and the first insulating layer 109 can be etched individually or simultaneously. A technique to control the etch selectivity has already been known in the art and, therefore, will not be described in detail.

It has been described above that the contact plugs 111 and the first insulating layer 109 are etched together. However, the first insulating layer 109 of the region where the odd bit lines will be formed can be etched in order to form the first trenches 113. In this case, although the first insulating layer 109 is etched, conductive material is brought in contact with the contact plugs 111 if the first trenches 113 are filled with the conductive material. Therefore, the same effects or results as those when the contact plugs 111 are etched can be obtained.

Figure 1C:
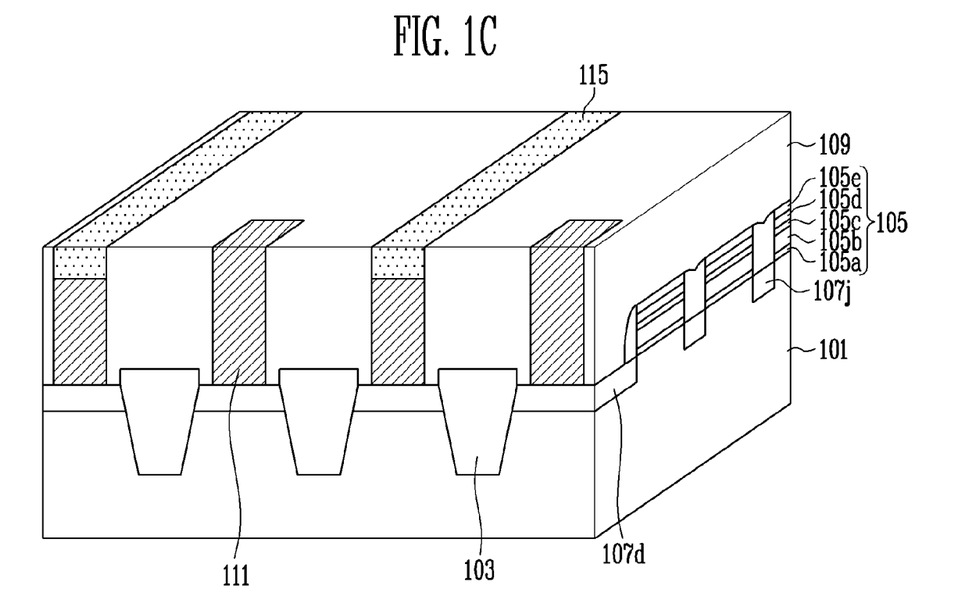

Referring to FIG. 1C, a conductive layer is formed over the first insulating layer 109 so that the first trenches 113 are filled. The conductive layer is etched such that the conductive layer remains within the first trenches 113. Thus, first metal lines 115 (hereinafter, referred to as "odd bit lines") are formed in the first trenches 113. The etch process of the conductive layer can be performed by a CMP process or an etch-back process.

Figure 1D:
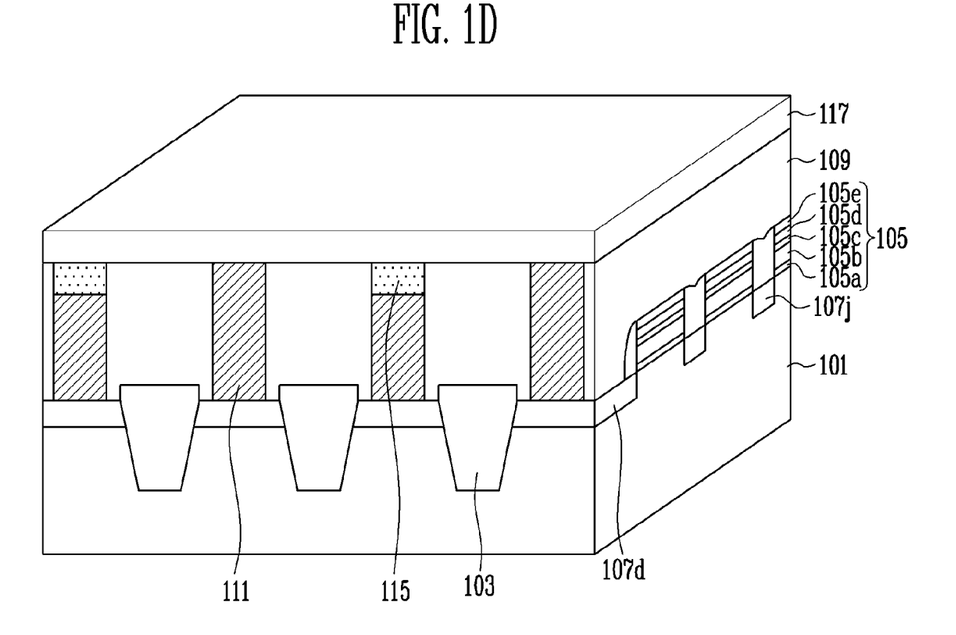

Referring to FIG. 1D, a second insulating layer 117 is formed over the semiconductor substrate 101 in which the odd bit lines 115 are formed. The second insulating layer 117 is formed of an oxide layer or a nitride layer, and can be formed from material with a dielectric constant lower than that of the oxide layer or the nitride layer.

Figure 1E:
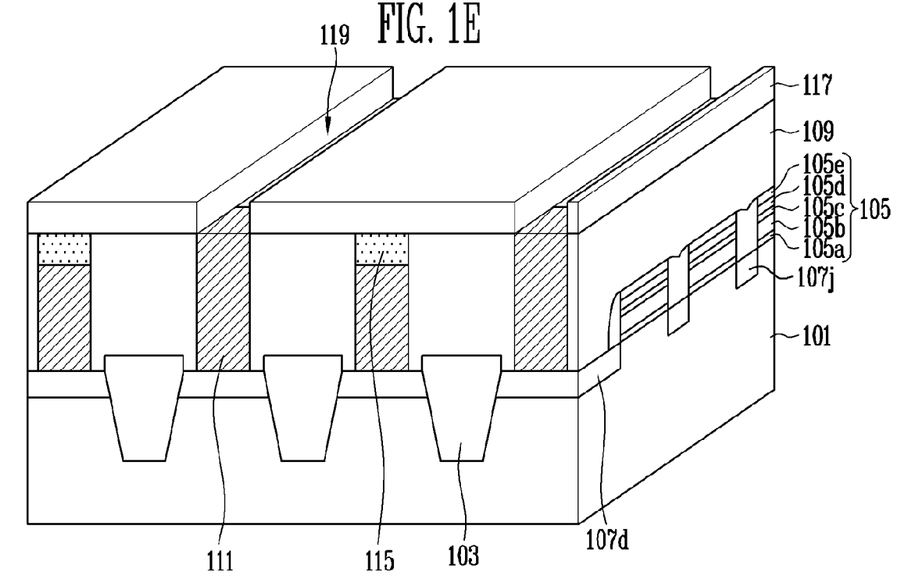

Referring to FIG. 1E, the second insulating layer 117 of regions where the even bit lines will be formed is etched to form second trenches 119. Unlike the case where the first trenches are formed, the second trenches 119 can be formed by etching the second insulating layer 117. The depth of the second trenches 119 decides the height of the even bit lines to be formed in a subsequent process. Thus, when the even bit lines are formed thickly, the second trenches 119 are formed deep, and when the even bit lines are formed thinly, the second trenches 119 are formed shallowly.

Figure 1F:
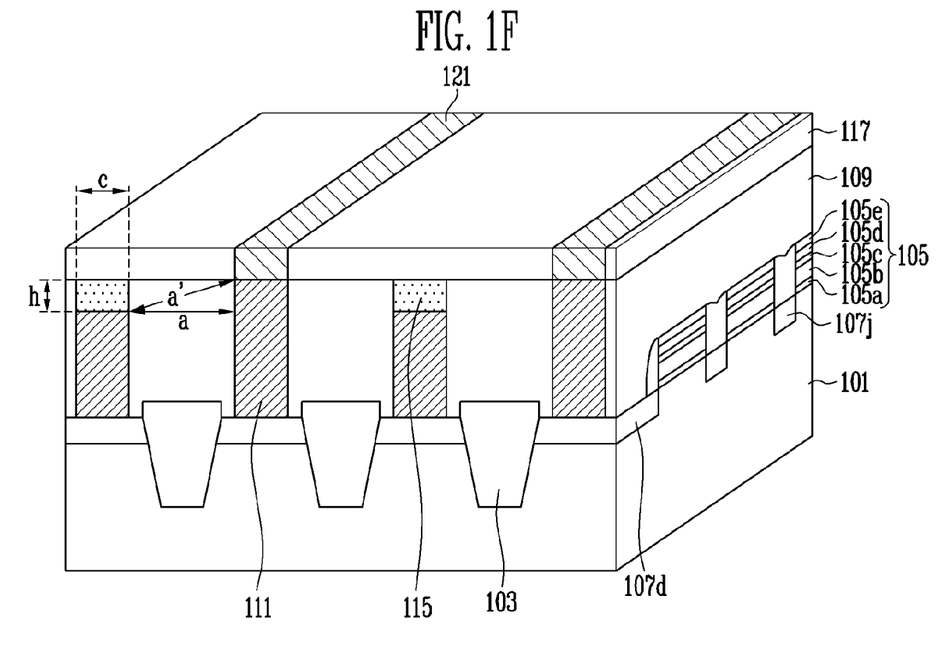

Referring to FIG. 1F, a conductive layer is formed over the second insulating layer 117 such that the second trenches 119 are filled. The conductive layer is etched so that it remains within the second trenches 119. Thus, second metal lines 121 (hereinafter, referred to as "even bit lines") are formed in the second trenches 119. The etch process of the conductive layer can be carried out by a CMP process or an etch-back process.

The conductive layer for the odd bit lines and the conductive layer for the even bit lines can be formed by using the same material, such as tungsten, copper, aluminum, titanium or platinum. Alternatively, the conductive layers for the odd bit lines and the even bit lines can be formed from different materials of the above materials. Further, the positions of the odd bit lines and the even bit lines can be switched. That is, the even bit lines can be formed in the first trenches and the odd bit lines can be formed in the second trenches.

By forming the steps between the odd and even bit lines as described above, loading capacitance between the bit lines can be decreased. In other words, assuming that the height of a lower bit line is h, a distance between the lower bit lines is c, a distance between the lower bit lines and upper bit lines is a', and the distance between bit lines when there is no step is a, the following equation is established.

$$a' = \sqrt{(h^2 + a^2)} \quad \text{[Equation]}$$

As in Equation 1, as the distance a' between the bit lines increases, capacitance between the bit lines can be decreased. Further, as the distance increases, the occurrence of bridge between the bit lines can be minimized.

A method of fabricating bit lines of a flash memory device according to another embodiment of the present invention is described below.

Figure 2:
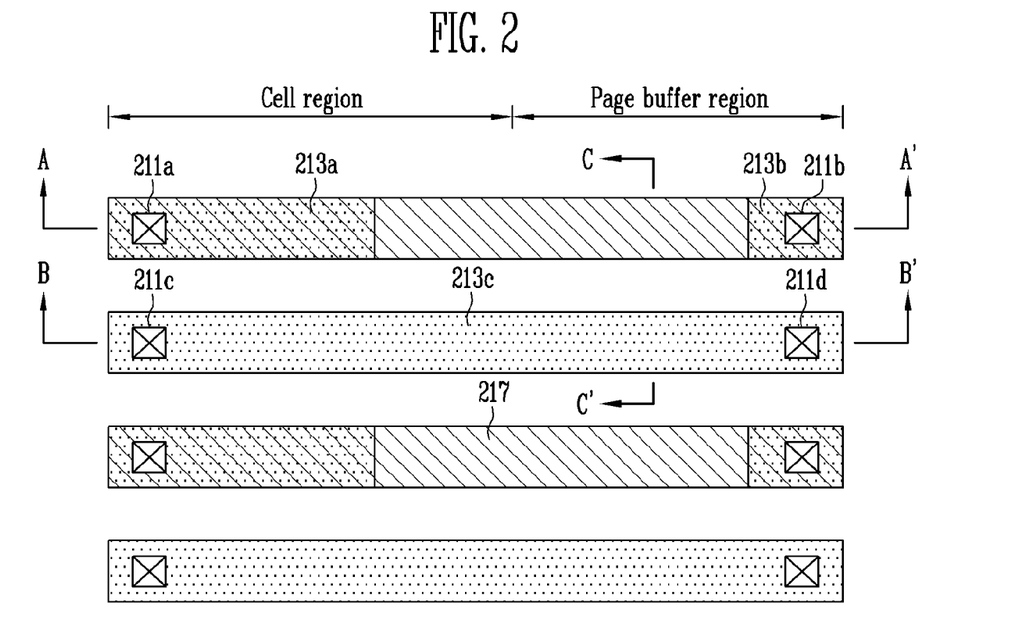
FIG. 2 is a plan view of a flash memory device in accordance with another embodiment of the present invention.
Figure 3A:
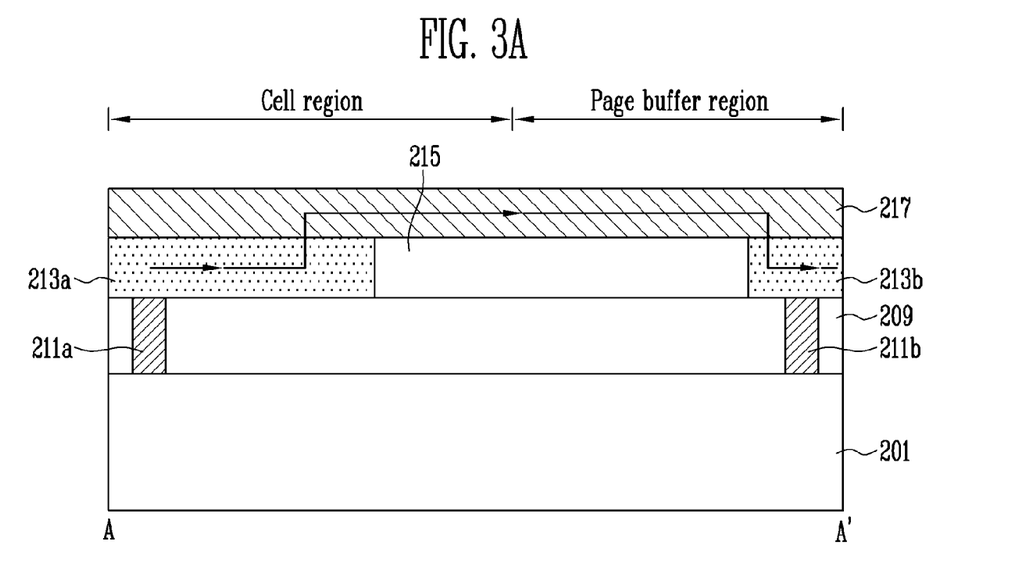
FIG. 3A is a cross-sectional view of the flash memory device taken along line A-A' of FIG. 2.
Figure 3B:
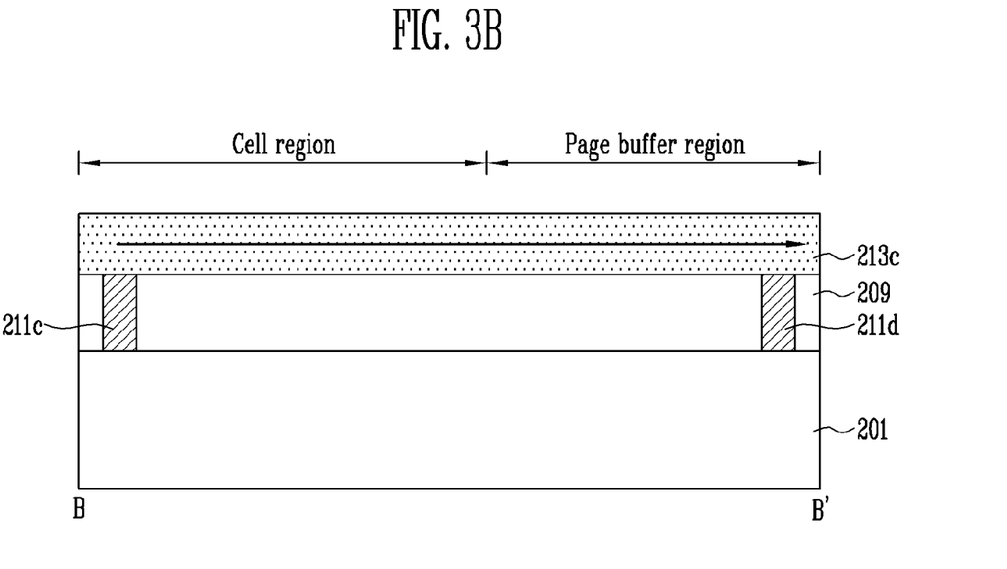
FIG. 3B is a cross-sectional view of the flash memory device taken along line B-B' of FIG. 2.
Figure 3C:
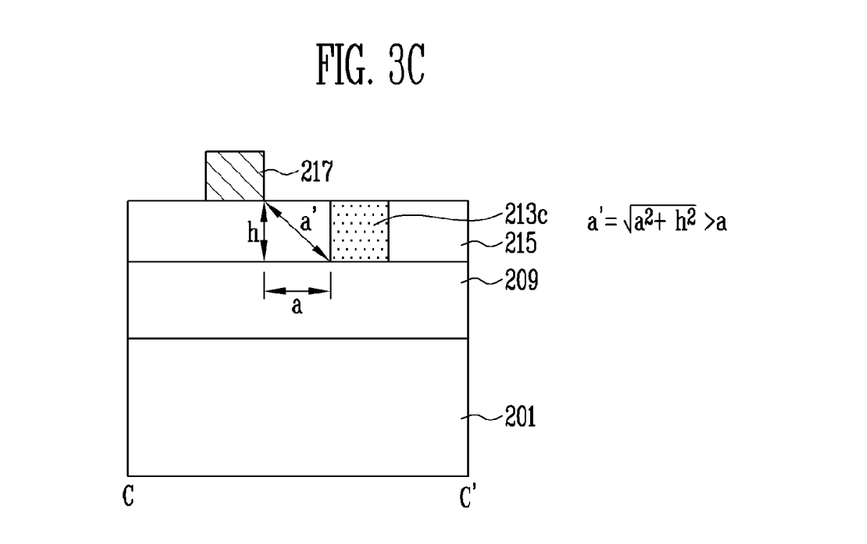
FIG. 3C is a cross-sectional view of the flash memory device taken along line C-C' of FIG. 2.

FIG. 2 is a plan view of a flash memory device in accordance with another embodiment of the present invention. FIG. 3A is a cross-sectional view of the flash memory device taken along line A-A' of FIG. 2. FIG. 3B is a cross-sectional view of the flash memory device taken along line B-B' of FIG. 2. FIG. 3C is a cross-sectional view of the flash memory device taken along line C-C' of FIG. 2.

Referring to FIG. 2, a plurality of bit lines are arrayed on a semiconductor substrate 201 having a cell region and a page buffer region. The bit lines can be classified into odd bit lines located at odd-numbered positions and even bit lines located at even-numbered positions depending on an arrangement order.

Referring to FIGS. 2 and 3A, the odd bit line includes a conductive layer 213a (hereinafter, referred to as a "first lower bit line") and a second metal line 217 (hereinafter, referred to as a "upper bit line"). The first lower bit line 213a is connected to a drain contact plug 211a in the cell region and extends lengthily in one direction (the page buffer direction). However, the first lower bit line 213a does not extend up to the page buffer region. The upper bit line 217 is formed over a layer different from that of the first lower bit line 213a, and connects the first lower bit line 213a and a conductive layer 213b of the page buffer region.

The first lower bit line 213a is insulated from the semiconductor substrate 201 of the cell region by a first insulating layer 209 formed over the semiconductor substrate 201, and is electrically connected to an underlying structure (for example, a drain) formed in the cell region through the contact plug 211a formed in the first insulating layer 209. Meanwhile, a contact plug 211b is formed within the first insulating layer 209 of the page buffer region. A conductive layer 213b, formed using the same material as that of the first lower bit line 213a, is formed over the contact plugs 211b and its neighboring first insulating layer 209. The upper bit line 217 connects the conductive layer 213b and the first lower bit line 213a and therefore electrically connects a flash memory cell and a page buffer of the cell region.

Referring to FIGS. 2 and 3B, the even bit lines located at the even-numbered positions are formed over the same plane as that of the first lower bit lines (refer to 213a of FIG. 3A) and include first metal lines 213c (hereinafter, referred to as "second lower bit lines"), which electrically connect the memory cell and the page buffer of the cell region.

The second lower bit line 213c is insulated from the semiconductor substrate 201 by the first insulating layer 209. The second lower bit line 213c is electrically connected to an underlying structure (for example, the drain) formed in the cell region through the contact plug 211c formed within the first insulating layer 209 and also electrically connected to an underlying structure formed in the underlying page buffer region through a contact plugs 211d formed within the first insulating layer 209.

Further, a second insulating layer (refer to 215 of FIG. 3A) is formed over the first interlayer insulating layer 209 in which the first and second lower bit lines 213a and 213c and the conductive layer 213b are not formed. The second insulating layer 215 can be formed of an oxide layer or a nitride layer.

According to the present invention constructed above, neighboring bit lines are not formed over the same plane, but formed over different planes. Thus, a distance between the bit lines, in particular, a distance between the bit lines in the page buffer region having a small pitch can be extended.

Referring to FIG. 3C, assuming that in the prior art in which bit lines are formed over the same plane, a distance between the bit lines is "a" and the height of the second lower bit line 213c is h, the distance "a'" between the bit lines in the semiconductor device of the present invention results in a'=$\sqrt{a^2+h^2}$. Accordingly, a'=a'=$\sqrt{a^2+h^2}$ is greater than "a" and, therefore, the distance between the bit lines is extended.

The fabrication method of the semiconductor device constructed above is as follows.

FIGS. 4A to 4D are cross-sectional perspective views illustrating a method of forming the bit lines of the flash memory device in the cell region of FIG. 2.

Figure 4A:
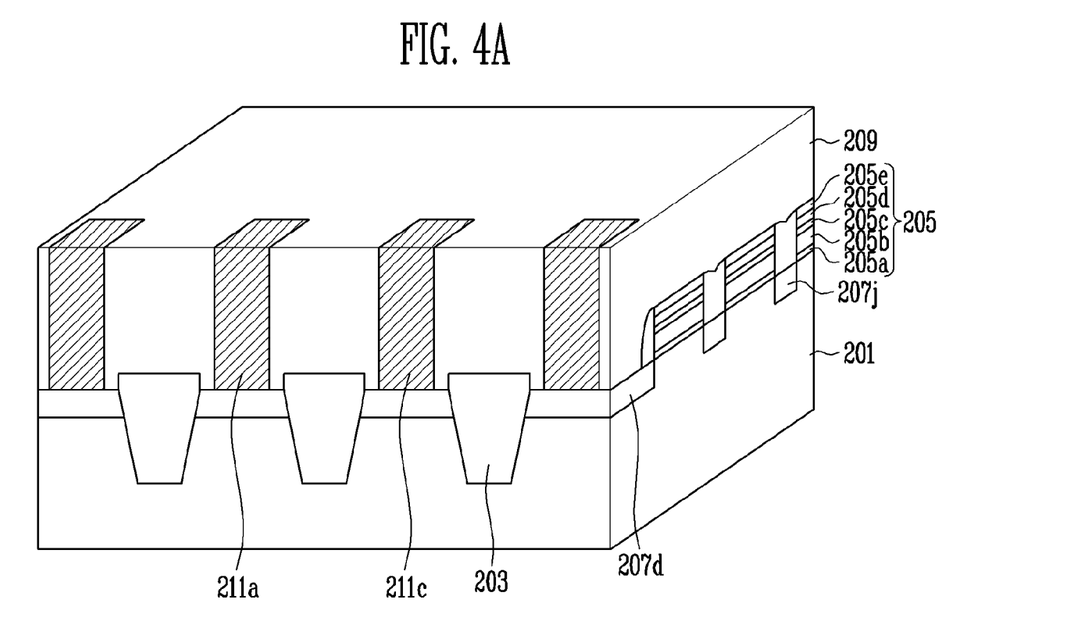
FIGS. 4A to 4D are cross-sectional views illustrating a method of forming bit lines of the flash memory device in a cell region of FIG. 2.

Referring to FIG. 4A, semiconductor elements, such as isolation layers 203 and flash memory cells 205, are formed in the semiconductor substrate 201. Junction regions 207j are formed in the semiconductor substrate 201 between the flash memory cells 205. A drain 207d and a source (not shown) are formed at both ends of a string structure. The drain 207d becomes the drain of a drain select transistor. The first insulating layer 209 is formed over the semiconductor substrate 201 in which the semiconductor elements are formed. The fabrication method is carried out in the same manner as that described with reference to FIG. 1A.

Figure 4B:
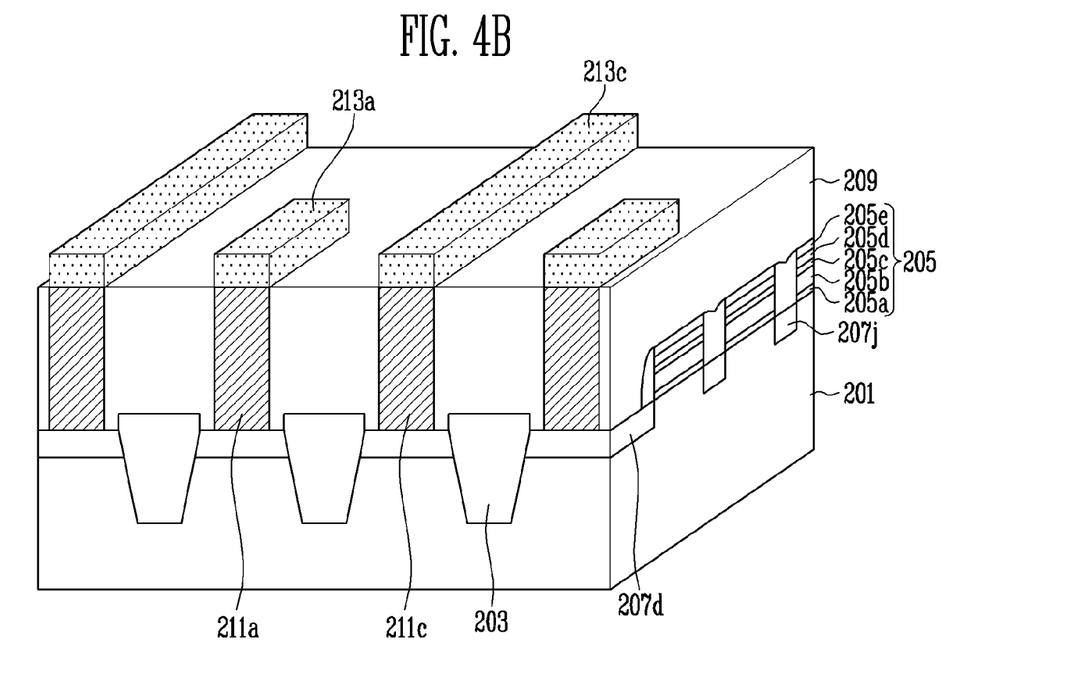

Referring to FIGS. 2 and 4B, a conductive material layer is formed over the first insulating layer 209 including the contact plugs 211a to 211c and then patterned. Thus, the even bit lines 213c connected to the drain contact plugs 211c are formed in the even bit line region. The even bit lines 213c extend up to the page buffer region and are connected to the contact plugs 211b formed in the page buffer region. The even bit lines 213c are also electrically connected to the page buffer through the contact plugs 211b. Further, part of the conductive layer remains in the odd bit line region, so that the lower bit lines 213a connected to the drain contact plugs 211a are formed. The lower bit lines 213a are formed in the cell region and extend toward the page buffer region in such a way that the width of the lower bit line 213a is wider than that of the drain contact plugs 211a.

Figure 4C:
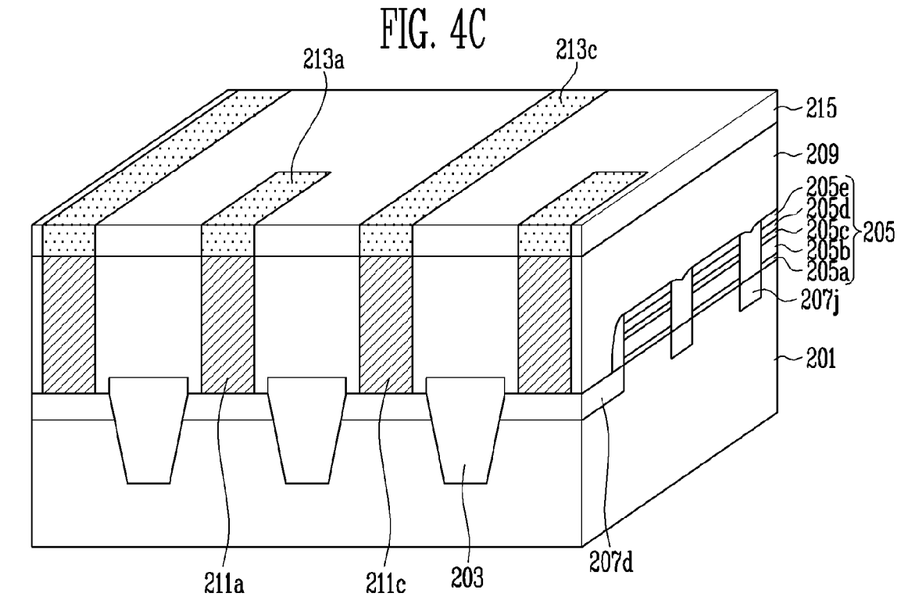

Referring to FIG. 4C, the second insulating layer 215 is filled between the even bit lines 213c and the lower bit lines 213a. The second insulating layer 215 is formed over the semiconductor substrate 201 so that the even bit lines 213c and the lower bit lines 213a are fully covered. A CMP process is performed until the even bit lines 213c and the lower bit lines 213a are exposed so that the second insulating layer 215 remains between the even bit lines 213c and the lower bit lines 213a. The second insulating layer 215 can be formed from an oxide layer or a nitride layer and can be formed from material with a dielectric constant lower than that of the oxide layer or the nitride layer.

Figure 4D:
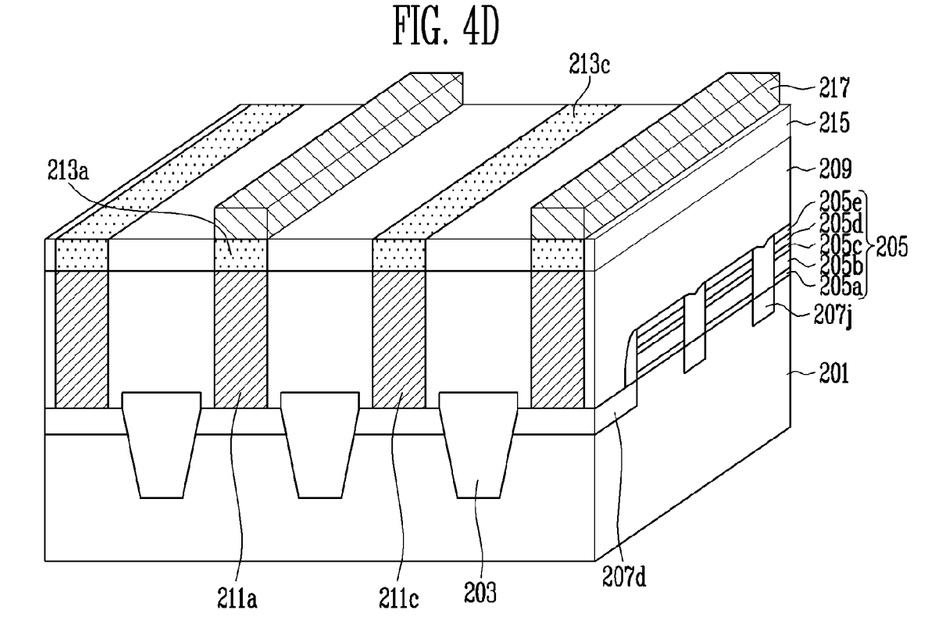

Referring to FIGS. 3A and 4D, the conductive layer 217 is formed over the second insulating layer 215 including the lower bit lines 213a and then patterned. The conductive layer 217 is patterned so that it extends up to the page buffer region, and is connected to the conductive layer 213b of the page buffer region, which is not connected to the even bit lines. Thus, the odd bit lines including the lower bit lines 213a and the conductive layer 217 are formed.

In the above embodiments, an example in which the odd bit lines include the lower bit lines 213a and the conductive layer 217 and the even bit lines 213c is formed of a single layer has been described. However, it is to be noted that the odd bit lines can be formed of a single layer and the even bit lines can include the lower bit lines 213a and the conductive layer 217.

Further, a case where the bit lines of the flash memory device are formed has been described above as an example. It is however to be noted that the above process can also be applied to a process of fabricating semiconductor devices having a narrow gap between metal lines since the metal lines are formed densely. In this case, the bit lines correspond to general metal lines.

As described above, the present invention can have the following advantages.

First, since even bit lines and odd bit lines are formed over different layers, steps are generated between the even bit lines and the odd bit lines. Accordingly, a gap between the even bit lines and the odd bit lines can be increased, loading capacitance between the bit lines can be decreased, and bridge between bit lines can be prevented.

Second, since mutual interference between the even and odd bit lines is prevented, a reduction in the cell current and the operating speed can be reduced.

Third, the number of process steps can be reduced since it is not necessary to form metal layers.

Although the foregoing description has been made with reference to the specific embodiments, it is to be understood that changes and modifications of the present patent may be made by the ordinary skilled in the art without departing from the spirit and scope of the present patent and appended claims.

What is claimed is:

1. A metal line of a semiconductor device comprising:
   contact plugs formed over a semiconductor substrate and insulated from each other by a first insulating layer;
   a plurality of first trenches formed in the first insulating layer and connected to first contact plugs of the contact plugs, which belong to one of an odd-numbered group and an even-numbered group;
   first metal lines formed within the first trenches and connected to the first contact plugs;
   a plurality of second trenches formed over the first metal lines and the first insulating layer and comprising a second insulating layer connected to second contact plugs of the contact plugs, which belong to the other of the odd-numbered group and the even-numbered group; and
   second metal lines formed within the second trenches and connected to the second contact plugs.

2. The metal line of claim 1, wherein the contact plugs comprise drain contact plugs of a NAND flash memory device and are arranged in a line.

3. The metal line of claim 1, wherein the first metal lines comprise odd bit lines of a NAND flash memory device and the second metal lines comprise even bit lines, or the first metal lines comprise the even bit lines and the second metal lines comprise the odd bit lines.

4. The metal line of claim 1, wherein the first metal lines and the second metal lines are connected to a plurality of page buffers.

5. The metal line of claim 1, wherein a sum of a height of the first contact plug and a height of the first metal line is identical to a height of the second contact plug.

6. A metal line of a semiconductor device comprising:
   contact plugs formed over a semiconductor substrate and insulated from each other by a first insulating layer;
   a plurality of first metal lines formed in the first insulating layer and connected to first contact plugs of the contact plugs, which belong to one of an odd-numbered group and an even-numbered group;
   a plurality of conductive layers formed over second contact plugs, which belong to the other of the odd-numbered group and the even-numbered group of the contact plugs;
   forming a second insulating layer over the first insulating layer between the first metal lines and the conductive layers; and
   a plurality of second metal lines formed over the second insulating layer and electrically connected to the conductive layers.

7. The metal line of claim 6, wherein the contact plugs comprise drain contact plugs of a NAND flash memory device and are arranged in a line.

8. The metal line of claim 6, wherein the first metal lines comprise odd bit lines of a NAND flash memory device and the second metal lines comprise even bit lines, or the first metal lines comprise the even bit lines and the second metal lines comprise the odd bit lines.

9. The metal line of claim 6, wherein the first metal lines and the second metal lines are connected to a plurality of page buffers.

10. The metal line of claim 6, wherein the conductive layer extends from on the first contact plugs to on the first insulating layer and has a width wider than the first contact plugs.

11. A method of forming metal lines of a semiconductor device, comprising:
    providing a semiconductor substrate in which contact plugs insulated by a first insulating layer are formed;
    forming first trenches connected to first contact plugs of the contact plugs, which belong to one of an odd-numbered group and an even-numbered group, in the first insulating layer;
    forming first metal lines within the first trenches;
    forming a second insulating layer over the first insulating layer comprising the first metal lines;
    forming second trenches in the second insulating layer so that second contact plugs of the contact plugs, which belong to the other of the odd-numbered group and the even-numbered group, are exposed; and
    forming second metal lines in the second trenches.

12. The method of claim 11, wherein the contact plugs comprise drain contact plugs of a NAND flash memory device and are arranged in a line.

13. The method of claim 11, wherein the first metal lines comprise odd bit lines of a NAND flash memory device and the second metal lines comprise even bit lines, or the first metal lines comprise the even bit lines and the second metal lines comprise the odd bit lines.

14. The method of claim 11, wherein a sum of a height of the first contact plug and a height of the first metal line is identical to a height of the second contact plug.

15. The method of claim 11, wherein a plurality of flash memory cells are formed in the semiconductor substrate.

16. A method of forming metal lines of a semiconductor device, comprising:
    providing a semiconductor substrate in which contact plugs insulated by a first insulating layer are formed;
    forming a conductive layer over first contact plugs of the contact plugs, which belong to one of an odd-numbered group and an even-numbered group, and forming first metal lines connected to second contact plugs, which belong to the other of the odd-numbered group and the even-numbered group, over the first insulating layer;
    forming a second insulating layer over the first insulating layer between the conductive layer and the first metal lines; and
    forming second metal lines connected to the conductive layer over the second insulating layer.

17. The method of claim 16, wherein the contact plugs comprise drain contact plugs of a NAND flash memory device and are arranged in a line.

18. The method of claim 16, wherein the first metal lines comprise odd bit lines of a NAND flash memory device and the second metal lines comprise even bit lines, or the first metal lines comprise the even bit lines and the second metal lines comprise the odd bit lines.

19. The method of claim 16, wherein the conductive layer extends from on the first contact plugs to on the first insulating layer and has a width wider than the first contact plugs.

20. The method of claim 16, wherein a plurality of flash memory cells are formed in the semiconductor substrate.

* * * * *